US006566732B1

(12) United States Patent
Leonardi

(10) Patent No.: US 6,566,732 B1
(45) Date of Patent: May 20, 2003

(54) HIGH VOLTAGE RESISTIVE STRUCTURE INTEGRATED ON A SEMICONDUCTOR SUBSTRATE

(75) Inventor: Salvatore Leonardi, Aci S. Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/425,445

(22) Filed: Oct. 22, 1999

(30) Foreign Application Priority Data

Oct. 23, 1998 (EP) ............................. 98830638

(51) Int. Cl.[7] ............................... H01L 29/00
(52) U.S. Cl. ................. 257/536; 257/537; 257/510; 257/513; 257/516
(58) Field of Search ................. 257/529, 536, 257/537, 538, 510, 513, 516, 494, 495, 488, 489, 490

(56) References Cited

U.S. PATENT DOCUMENTS

| 4,314,269 A | * | 2/1982 | Fujiki | 257/536 |
| 5,233,215 A | * | 8/1993 | Baliga | 257/490 |
| 5,316,978 A | | 5/1994 | Boyd et al. | 437/203 |

FOREIGN PATENT DOCUMENTS

| EP | 0211622 A1 | 2/1987 | 257/355 |
| JP | 62165352 | 7/1987 | 257/536 |
| JP | 62177959 | 8/1987 | 257/536 |
| JP | 09257831 | 10/1997 | 257/536 |

* cited by examiner

Primary Examiner—Steven Loke
(74) Attorney, Agent, or Firm—Lisa K. Jorgenson; David V. Carlson; SEED IP Law Group PLLC

(57) ABSTRACT

A resistive structure integrated on a semiconductive substrate is described. The resistive structure has a first type of conductivity formed into a serpentine region of conductivity which is opposite to that of the semiconductive substrate. In at least two parallel portions of the serpentine region, there is at least one trench filled with an insulating material.

6 Claims, 3 Drawing Sheets

HIGH VOLTAGE RESISTIVE STRUCTURE INTEGRATED ON A SEMICONDUCTOR SUBSTRATE

TECHNICAL FIELD

The present invention relates to an integrated high voltage resistive structure on a semiconductive substrate, and more specifically to a serpentine integrated resistive structure on a semiconductive substrate having a first type of conductivity opposite to that of the semiconductor substrate.

BACKGROUND OF THE INVENTION

Embodiments of the invention relate in particular, but not exclusively to a resistive structure at high voltage to be integrated on a semiconductive substrate together with power devices and the following description is made with reference to this field of application with the sole objective of simplifying its disclosure. Discussion of steps or processes well known to those skilled in the art has been abbreviated or eliminated for brevity.

As is well known, high voltage resistive structures which are integrated on a semiconductive substrate find ample use in the application field for power devices formed as integrated circuit, for example VIPower devices.

VIPower devices integrate on the same chip a region on which the power devices are formed (power region) and a region on which signal devices are formed (signal region). In some applications, it is necessary to arrange, inside the signal region, a division of the substrate voltage. This can be provided by using a resistive structure connected between the substrate and a control region of the signal device. This resistive structure will therefore be subjected to the substrate voltage Vs which as is well known, in devices of the VIPower type, can reach elevated values of up to 2KV, hence the term resistive structure or high voltage resistance HV.

In FIGS. 1 and 2 the electrical diagrams of two examples of possible applications of the high voltage resistive structures are shown.

In FIG. 1 for example, a first circuit structure C1 is shown comprising a bipolar component Q1 of the NPN type connected in series on the emitter region to a first terminal of the resistance R1. A Zener diode D1 is connected, in inverted polarization, between the base terminal of the component Q1 and a second terminal of the resistance R1. A high voltage resistance $R_{HV}$ is connected between the collector region and the base region of the component Q1.

When a current I1 flows through the resistance $R_{HV}$, the component Q1 switches on and drives a low voltage circuitry BT connected to an emitter region of the component Q1. The current which flows through the resistance $R_{HV}$ obviously depends on the substrate voltage Vs and on the value of the resistance itself.

In FIG. 2, a second circuit structure C2 is shown comprising two circuit branches 1a and 2a having a common node A. The first branch 1a comprises a Zener diode chain D2, D3 and D1 connected to the base region of a first bipolar component Q2, which is polarized by a resistance R2. The second branch 2a comprises a resistance R3 connected in series to the emitter region of a second bipolar component Q3, which is controlled by a battery Vb. A high voltage resistance $R_{HV}$ is then connected to node A.

In this configuration the voltage value on node A can be used as a reference value for permitting conduction on branch 1 or on branch 2, depending on the value of Vz of the Zener chain, of the Vb battery voltage as well as from the other components present in the circuitry. In this case, the resistance $R_{HV}$ is used simply as a voltage divider.

In both examples, the voltage of substrate Vs applied to the resistance $R_{HV}$, as said before, can reach elevated values. The voltage divider used as a driver signal for the linear region (circuit C2), and also the current which flows through the resistance HV (circuit C1), assumes values which must be comparable and therefore not above the maximum voltage of the well inside which the signal circuitry is integrated, and therefore of the maximum current foreseen for a determined circuit structure. This means that the resistance $R_{HV}$ must have a resistive value such as to permit the division or the current required by the driving circuitry as foreseen by the circuit structure used.

This resistance value can also be in the order of some M$\Omega$ and in any case not less than a few tens of K$\Omega$.

A first known technical solution for the formation of resistive structures with high resistive values foresees forming doped regions having a high resistivity on a semiconductive substrate.

Though advantageous in many respects, this first solution has various problems, in particular, when forming regions of high resistivity, fairly high area dimensions are required for the die.

Another solution of the prior art foresees the formation of long resistive structures which, according to the area used, minimize the dimensions of silicon occupied thanks to a particular layout.

One layout embodiment according to the prior art is shown in FIG. 3. In particular, in a substrate 1' of N type a serpentine region 2' of P type is formed. This type of layout, nevertheless, cannot be used for the resistive structure at high voltage, because it would occupy a fairly large area of silicon. This is due to the size of the depletion region 3', outlined in FIGS. 3 and 4, that is inversely proportional to the concentration of dopant (and therefore directly proportional to the resistive value), during inverted polarization of a portion of doped silicon and therefore the size of this depletion region is very important in the resistive structures $R_{HV}$.

Even if the high voltage resistive structures can be integrated by using the more resistive layers used in the technology, VIPower devices capable of supporting elevated voltages necessarily have an elevated resistivity of the substrate, in varying degrees of size bigger than the more resistive layers available with current technological processes. This means that layouts which tend to optimize area availability of silicon on chips such as that of FIG. 3, have the problem of pinch-off phenomenon.

In particular, the depletion regions of two or more parallel branches of the resistive structure come into contact, as illustrated on the right side of FIG. 4, with subsequent alterations in the values of the resistive structure itself and therefore of the functioning of the circuitry of which it is a part.

In order to overcome this problem, it is necessary in the design phase of the layout for the high voltage resistive structure that the distance between the various branches of the serpentine resistive structure which face each other in parallel, should be more than the total of the widths of the depletion regions which belong to each branch. This means that the branches of the resistive structure subjected to a high voltage must be set apart according to the drop in voltage on the resistive structure itself.

As a consequence of this, the layout in FIG. 4, in the case of a high voltage resistance structure, takes the form shown in FIG. 5 with considerable dimensions of silicon areas.

Furthermore, the high voltages placed on the resistive structure, would require border structures, capable of protecting the more pressing regions against premature breakdowns from the high voltages. Metal field plates or rings with a high resistive structure are used for example in this case, which anyway tend to further increase the area of silicon occupied.

In order to reduced the lateral depletion region between the various branches of the resistive structure, a known technique enriches the layer intended for integration of the resistive structure itself. Nevertheless this solution reduces the capability of the device to hold the voltage, in that in order to obtain a reduction of the widening of the depletion region it would be necessary to have a concentration of dopant in the surface region which would be very high.

The same considerations made above can also be repeated in the case in which the high voltage resistive structure is integrated around the region at high voltage which surrounds the device. In this way, especially if the device occupies a large area, a length of the resistive structure equal to a fraction of the entire perimeter of the device or at most equal to one or two perimeters permit the formation of the resistive structure desired.

In this case, in fact, the distances to be kept in mind in the design phase, involve the distances between the branches of the resistive structure itself and the well in which the power device is formed.

SUMMARY OF THE INVENTION

Embodiments of the present invention form a serpentine resistive structure integrated on a semiconductive substrate, having structural and functional features such as to allow high voltage to be sustained without incurring the pinch-off phenomenon between the parallel branches of the serpentine, overcoming the limitations and drawbacks which limit now the resistive structures formed according to the prior art.

The resistive structure is formed with integrated serpentine on a semiconductive substrate, in which, between at least two parallel portions of the serpentine, insulation regions are formed.

The characteristics and advantages of the device according to these embodiments are presented in the description, given hereinbelow, of an example of embodiment given as an example and not limiting with reference to the attached designs.

DETAILED DESCRIPTION

Figure 1:
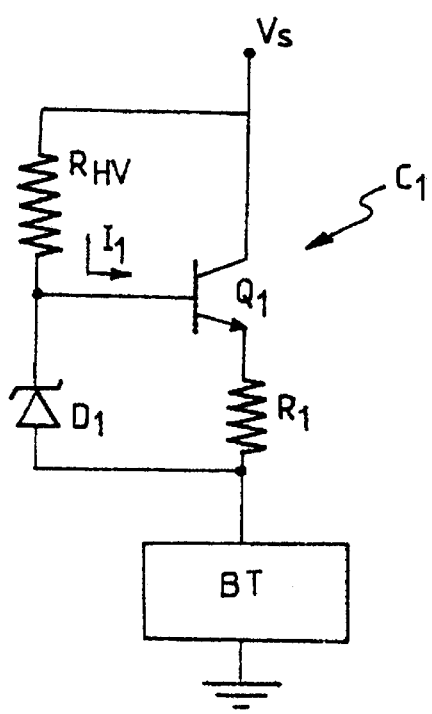
FIG. 1 shows a schematic view of a driving circuit in which a high voltage resistance of the known type is used.
Figure 2:
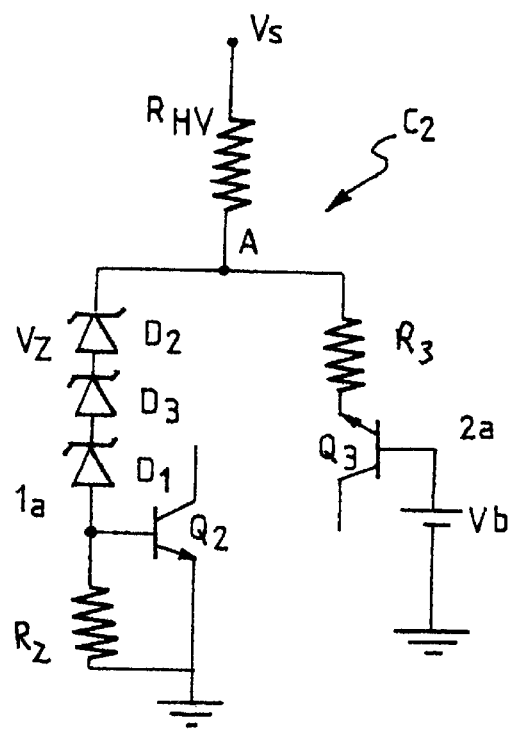
FIG. 2 shows a schematic view of a divider circuit in which a high voltage resistance of the known type is used.
Figure 4:
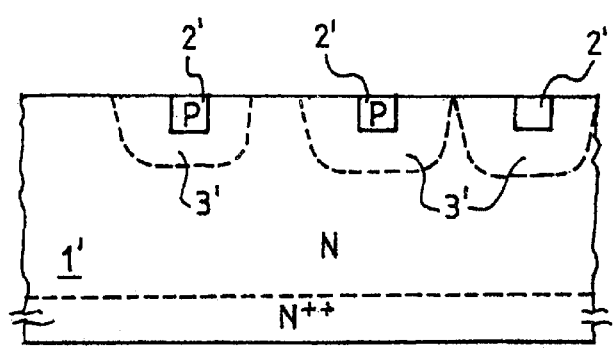
FIG. 4 shows a cross-sectional view along the IV—IV line of FIG. 3.
Figure 3:
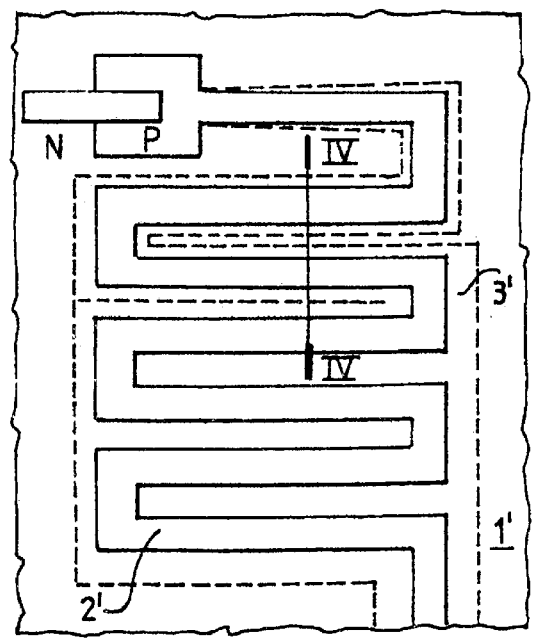
FIG. 3 shows a schematic top view of a portion of semiconductive substrate in which a first embodiment of a resistive structure is integrated according to prior art.
Figure 5:
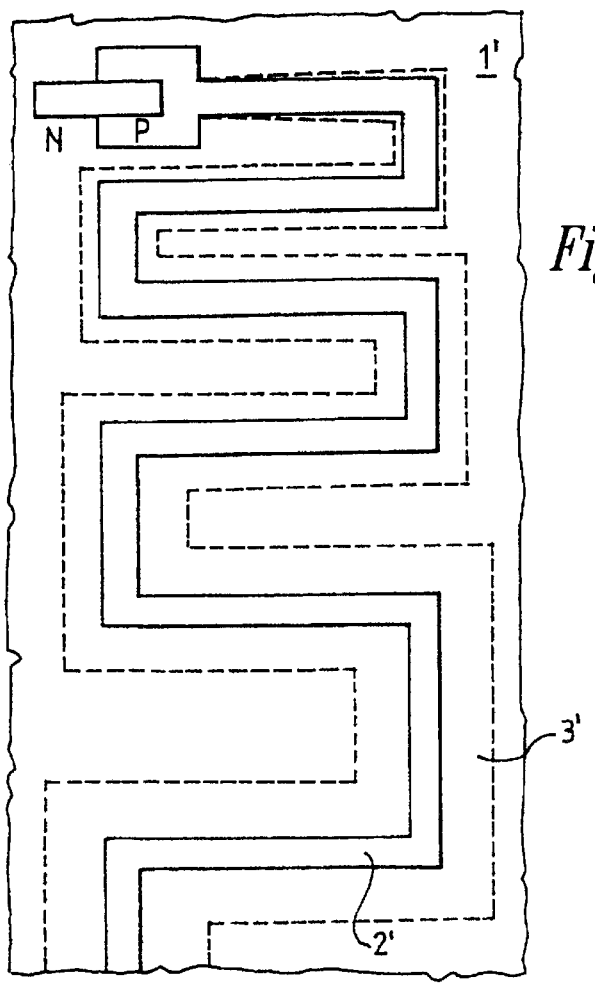
FIG. 5 shows a schematic top view of a portion of semiconductive substrate on which a second embodiment of a resistive structure has been integrated according to prior art.
Figure 6:
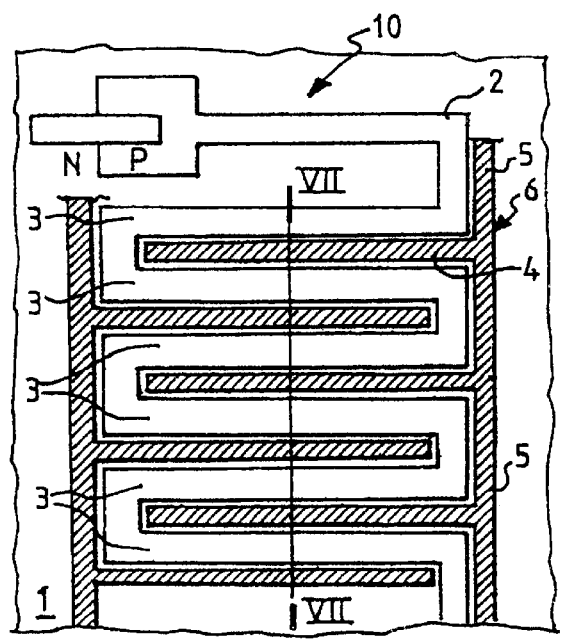
FIG. 6 shows a schematic top view of a portion of semiconductive substrate in which a first embodiment of a resistive structure has been integrated according to the invention.
Figure 7:
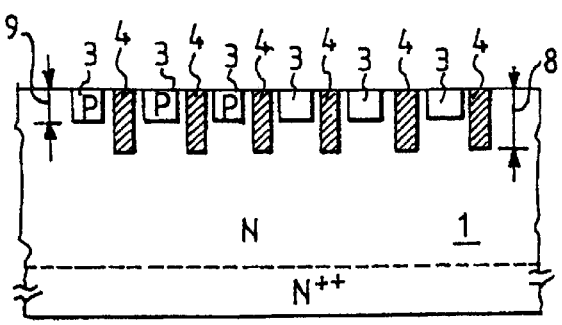
FIG. 7 shows a cross-sectional viewalong the VII—VII line of FIG. 6.

With reference to FIG. 6, with 10 a resistive structure according to an embodiment of the invention is indicated. On a semiconductor substrate 1 of a first type of conductivity, for example of N type, a serpentine region 2 of a second type of conductivity is formed. Such serpentine region 2 comprises at least one portion 3 which is substantially straight. In particular, the serpentine region 2 comprises a series of portions 3 parallel to each other. Between these parallel portions 3 of the serpentine region 2 at least one dielectric insulation region 4 (trench) is formed.

These trenches 4 engage on line 5, still of dielectric material, which substantially flows perpendicularly to the portions 3 of the serpentine regions 2. As can clearly be seen in FIG. 6, a series of trenches 4 and line 5 form protective structure 6 which has a comb configuration. Advantageously, two comb configured protection structures 6 are engaged on opposite sides of the serpentine region 2. With such configuration the perimeter of region 2 is substantially surrounded by dielectric regions.

The presence of trenches 4, according embodiments of the invention avoids the formation of the depletion region 3' which, in prior art structures, is located around those portions of the serpentine region 2 which is subjected to high voltage.

In polarization Vs conditions of the substrate 1, the presence of trenches 4 placed in proximity of the external region to the serpentine region 2, allow the equipotential lines to reach the surface of the substrate along the internal walls of the dielectric region of the trench.

Though the dimensions of the trench widthwise are (¼ $\mu$m) much smaller than those of the depletion region necessary in resistive structure formed according to prior art (and therefore with a higher electric field when the same voltage is applied), the trench structure according to a preferred embodiment of the invention can withstand higher voltage as long as the critical electric field value in the oxide (about 600 V/$\mu$m) is much higher than it is in the silicon (20 V/$\mu$m per high voltage structure).

Advantageously, in a preferred embodiment of the invention, the vertical dimensions of the trenches 4, width and depth, must be greater than that of the serpentine resistive structure 2 in order to protect the resistive structure from premature breakdowns.

Figure 8:
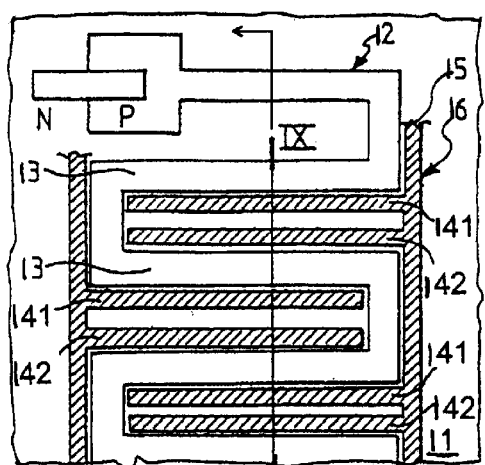
FIG. 8 shows a schematic top view of a portion of semiconductive substrate in which a second embodiment of a resistive structure HV has been integrated according to the invention.
Figure 9:
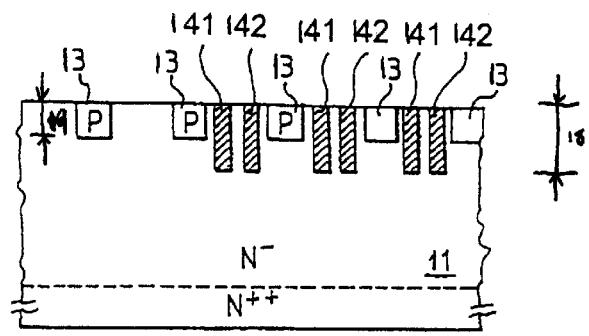
FIG. 9 shows a cross-sectional viewalong the IX—IX line of FIG. 8.

A second embodiment which is particularly advantageous is shown in FIGS. 8 and 9. In the portions of the serpentine region 12 more subjected to high voltage, two trenches 141 and 142 are formed between parallel portions 13.

Also a metal contact line formation, for example a metal field plate line suitably formed over the serpentine region 12, can improve the distribution of the potential lines above all in the proximity of the surface regions.

Also in this embodiment, the depth 18 of the protection structure 16, and therefore the single trenches 141, 142, must be such to reduce the depletion of the region of substrate 11 which surround the serpentine region 12.

According to embodiments of the invention, in fact the depth 18 of the trenches 141, 142 is greater than the depth 19 of the portions 13 of the serpentine region 12. In this way, the side depletion of the substrate region 11 is avoided.

Figure 10:
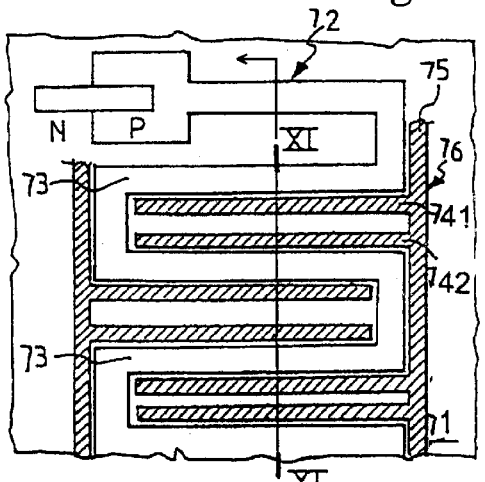
FIG. 10 shows a schematic top view of a portion of semiconductive substrate in which a third embodiment of resistive structure HV has been integrated according to the invention.
Figure 11:
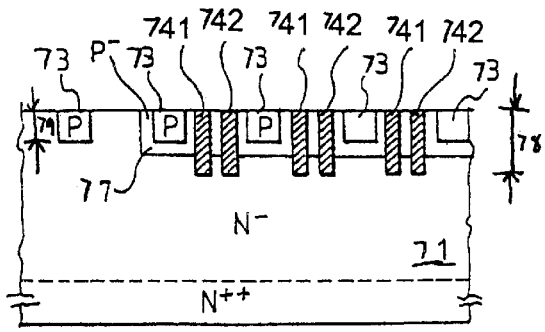
FIG. 11 shows a cross-sectional view along the XI—XI line of FIG. 10.

A third embodiment is shown in FIGS. 10 and 11. Such embodiment is particularly advantageous in improving voltage hold, above all in the embodiment in which several trenches are used. In the substrate 71 of N type, a spacer region 77 of P– type is formed, in which a serpentine region 72 of P type is formed. According to embodiments of the invention, at least one dielectric trench 74, for instance 741 or 742, is located between parallel portions 73 of the serpentine region 72. The depth of the region of spacer 77 is, advantageously in a preferred embodiment, greater than the depth 79 of the serpentine region 72 and smaller than the depth 78 of the trenches.

The presence of the spacer region 77 forms, in the resistive structure according to embodiments of the invention, a junction "pn" which allows the entire structure to withstand a higher voltage, restoring, even though in a smaller way, the depletion effect which occurs in the case of on board structures formed by means of high resistivity rings.

Figure 12:
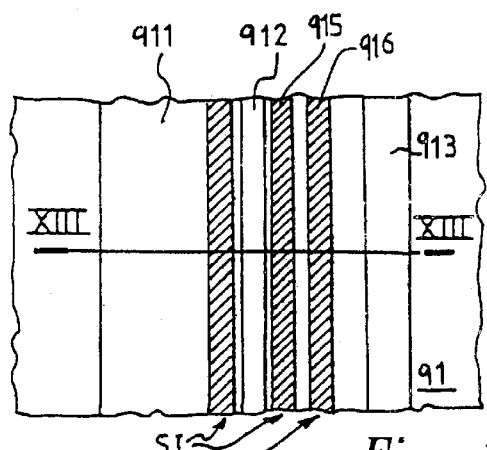
FIG. 12 shows a schematic top view of a portion of semiconductive substrate in which a fourth embodiment of a resistive structure HV has been integrated according to the invention.
Figure 13:
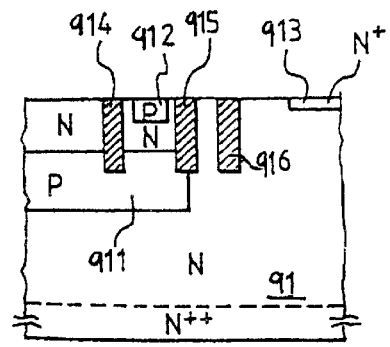
FIG. 13 shows a schematic view in vertical section along the XIII—XIII line of FIG. 12.

A fourth embodiment is shown in FIGS. 12, 13. In a substrate 91 of the N type a first buried region 911 of P type is formed. A resistive region 912 of high voltage of the P type is formed above the buried region 911. The resistive region 912 and a region 913 of N+ type form a border structure which is formed on the surface of substrate 91.

A protection structure SI surrounds at least one portion of the resistive structure 912. Also in this embodiment the presence of the protection structure SI avoids the side depletion of region 912.

For example, the protection structure SI comprises a pair of trenches 914 and 915 which are formed on both sides of the resistive region 912.

Advantageously, these trenches 914 and 915 contact the buried region 911.

Advantageously, another trench 916 is formed between the resistive region 912 and the region 913 of N+ type.

As is shown in this fourth embodiment it is possible to produce resistive structures at high voltages integrated in border structures.

As shown in FIG. 13, a border structure comprising a semiconductor substrate having a first doping type and a first concentration; a first buried region having a second doping type; a high voltage elongated doped resistive region of a second concentration of the second doping type formed within the first buried region, a second region having a second concentration of the first doping type formed in the semiconductor substrate outside of the first buried region; and an insulating material placed in a trench formed between the high voltage elongated doped resistive region and the second region.

In this way, it is possible to anularly integrate this border structure around the portion of substrate in which power devices have been formed, thereby reducing the area of silicon used.

In conclusion, the side dimensions of the protection structure 6 which surrounds the serpentine region 2 at high voltage are reduced with respect to the serpentine region 2 at high voltage formed according to the prior art, even when the resistive structure according to embodiments of the invention comprised several trenches.

The same silicon area being taken up, these embodiments allow the rather long resistive serpentine region 2 to be integrated, with a corresponding advantage of a higher value of resistive structure. Vice versa, the resistive structure being the same, the silicon area used by the resistive structure according to embodiments of the invention is smaller with respect to the case of resistive structure formed according to prior art.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. A structure in a semiconductor substrate comprising:

a semiconductor substrate of a first conductivity type and a first dopant concentration;

a first comb having a trunk and a first and second prong wherein the first and second prongs form a set, and a plurality of sets are coupled to the trunk;

a second comb having a trunk and a first and second prong wherein the first and second prongs form a set, and a plurality of sets are coupled to the trunk; and a serpentine resistor of a second conductivity type and a second dopant concentration and interlaced between the plurality of sets of the first comb and the plurality of sets of the second comb thereby enclosing the serpentine resistor within the first and second combs.

2. The structure in a semiconductor substrate according to claim 1, wherein the second dopant concentration is greater than the first dopant concentration.

3. The structure according to claim 1, wherein the trunk and plurality of sets of the first comb further comprises a trench region having a depth extending into the semiconductor substrate.

4. The structure according to claim 3, wherein the trench region contains a dielectric material.

5. The structure according to claim 4, wherein the dielectric material is an oxide material.

6. The structure according to claim 1, wherein the first dopant is N type and the second dopant is P type.

* * * * *